(12) United States Patent
Smayling et al.

(10) Patent No.: US 6,741,333 B2
(45) Date of Patent: May 25, 2004

(54) MULTIPLE IMAGE PHOTOLITHOGRAPHY SYSTEM AND METHOD

(75) Inventors: Michael C. Smayling, Sunnyvale, CA (US); Frank Tittel, Houston, TX (US); William L. Wilson, Jr., Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 62 days.

(21) Appl. No.: 10/406,030

(22) Filed: Apr. 2, 2003

(65) Prior Publication Data

US 2003/0210384 A1 Nov. 13, 2003

Related U.S. Application Data

(62) Division of application No. 09/692,685, filed on Oct. 19, 2000, now Pat. No. 6,567,153.

(51) Int. Cl.[7] .................. G03B 27/62; G03B 27/58; A47G 1/12
(52) U.S. Cl. .............. 355/75; 355/72; 428/14
(58) Field of Search .............. 355/75, 53, 72; 359/629; 428/14; 430/5

Primary Examiner—Peter B. Kim
(74) Attorney, Agent, or Firm—Peter K. McLarty; W. James Brady, III; Frederick J. Telecky, Jr.

(57) ABSTRACT

A multiple image photolithography system includes a radiation source (18) projecting electromagnetic radiation along a path. A reticle cartridge (26) is located in the path of the projected radiation. The cartridge (26) includes a photomask (34,36) located in the path of the projected radiation and a Fabry-Perot interferometer (54) located in the path of the projected radiation. A radiation-sensitive material (30) is located in the path of the projected radiation such that the projected radiation encounters the reticle cartridge (26) before the projected radiation encounters the radiation-sensitive material (30).

4 Claims, 3 Drawing Sheets

MULTIPLE IMAGE PHOTOLITHOGRAPHY SYSTEM AND METHOD

This application is a divisional of application Ser. No. 09/692,685, filed Oct. 19, 2000 now U.S. Pat. No. 6,567,153.

TECHNICAL FIELD OF THE INVENTION

This invention relates generally to the field of focussing electromagnetic radiation, and more particularly to a multiple image photolithography system and method.

BACKGROUND OF THE INVENTION

Integrated circuits are produced from wafers of silicon or some other semiconductor material. A typical process for producing an integrated circuit includes photolithography. The design of the circuit to be produced requires that certain surface portions of the silicon have specific electronic characteristics. Those characteristics are modified by exposing the silicon to other elements that migrate into the silicon crystal. Because the change in conductivity is desired only in certain areas, a material is used to coat the silicon and impede the migration. Photolithography is used to remove the coating from only those surface areas where migration, and the concomitant modification of electronic characteristics, is desired. Photolithography is also used to place conductive materials at specific points on the wafer. The manufacture of liquid crystal devices and magnetic heads may also include the use of photolithography.

The smaller the scale at which electronic characteristics can be manipulated, the more circuit elements can fit onto a chip of given area. More features may also be included in a liquid crystal device or magnetic head of a given size as a result of more exacting photolithography. As the size of circuit elements has decreased, photolithography equipment has become more exacting so that greater resolution can be achieved. Replacing a photolithographic stepper in order to increase the resolution and the depth of focus is very expensive. Large capital costs delay the improvement of photolithographic resolution.

Photolithography may be employed many times in the manufacture of a single device. For example, an integrated circuit may be formed of over twenty layers, the pattern for each layer projected onto the device using photolithography. Over the course of adding many layers to a device, the surface of the device may develop undulations. In may be desired that the photolithographic equipment be able to focus the pattern of light on a surface with varying vertical dimensions. New generations of photolithographic steppers are able to focus radiation with greater precision across the surface of the wafer or other device, i.e., in the horizontal dimensions. As the precision of focus in the horizontal direction is increased, the range in the vertical direction over which this precision occurs in decreased. The range over which the image stays in focus in the vertical dimension is called the depth of field. Thus, it may be desired to focus radiation very narrowly in the surface dimensions and maintain that focus over some range in the vertical dimension.

SUMMARY OF THE INVENTION

Accordingly, a need has arisen in the art for an improved photolithography system. The present invention provides a multiple image photolithography system and method that substantially reduce or eliminate problems associated with prior photolithography systems.

In accordance with the present invention, a multiple image photolithography system includes a radiation source. The radiation source provides electromagnetic radiation that is then projected along a path. The system also includes a radiation-sensitive material located in the path of the projected radiation. A reticle cartridge is located in the path of the projected radiation between the radiation source and the radiation-sensitive material. The reticle cartridge contains a photomask and a Fabry-Perot interferometer. The photomask and interferometer are located in the photomask so as to lie in the path of the projected radiation.

More specifically, in accordance with one embodiment of the present invention, the reticle cartridge is positioned with the photomask preceding the interferometer in the projected radiation path.

Also in accordance with the present invention, a method for projecting multiple radiation images onto photoresist includes inserting a substrate with a photoresist coating into a stepper and positioning the photoresist within the path of radiation projected by a radiation source in the stepper. A Fabry-Perot interferometer and a photomask are inserted into the stepper and each is positioned in the radiation path with the photomask between the interferometer and the radiation source. Radiation is projected from the radiation source, passes through the photomask and interferometer and then reaches the photoresist.

Technical advantages of the present invention include improving the depth of focus of the radiation pattern projected by a stepper onto a radiation-sensitive material. Another technical advantage is allowing for a Fabry-Perot interferometer to be placed within and removed from the radiation path of a stepper without expensive modifications to the stepper. Another technical advantage is an increase in the pattern resolution without the large capital cost of upgrading stepper equipment. Other technical advantages of the present invention will be readily apparent to one skilled in the art from the following figures, descriptions, and claims. Individual embodiments of the invention do not necessarily include all the technical advantages.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

The preferred embodiments of the present invention and its advantages are best understood by referring now in more detail to the figures in which like numerals refer to like parts.

Figure 1:
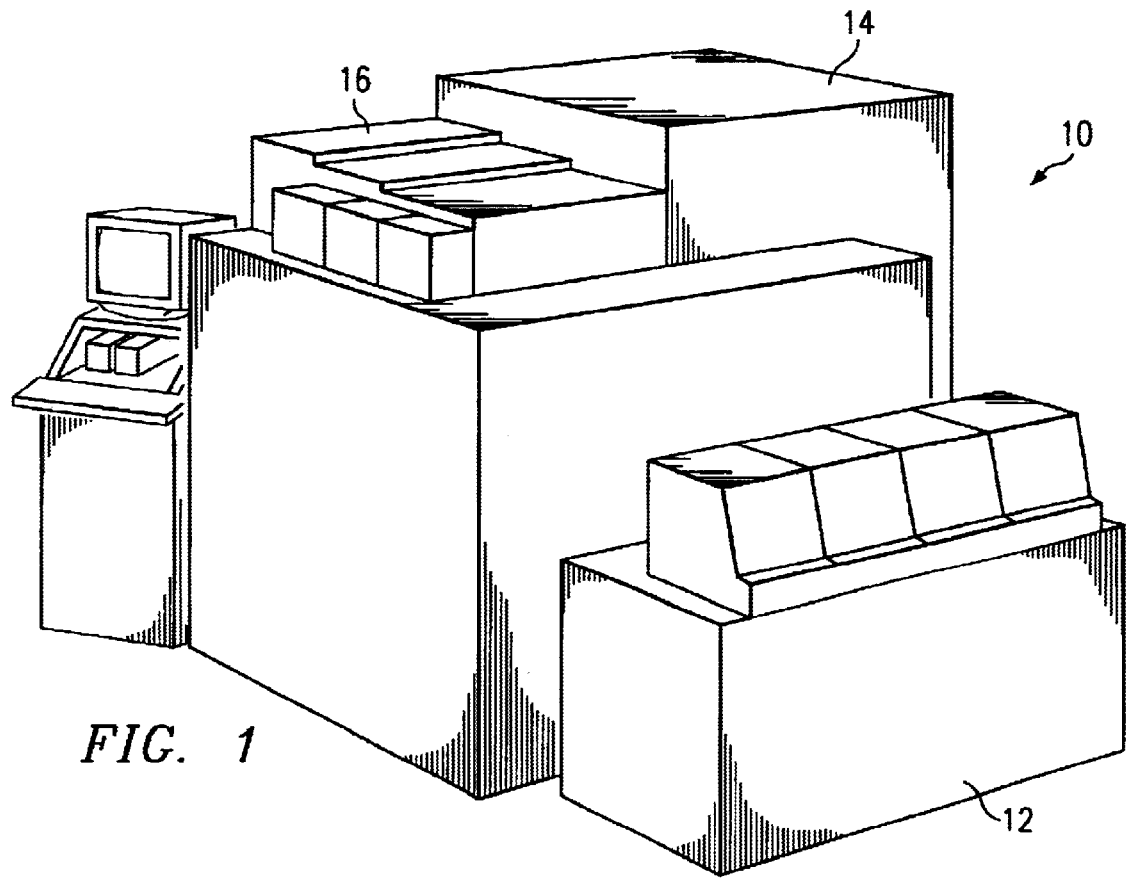
FIG. 1 is a perspective view of a stepper.

FIG. 1 is a perspective view of a stepper 10. The stepper 10 is a very expensive apparatus that projects a pattern of electromagnetic radiation onto a radiation-sensitive material.

For example, integrated circuits may be formed on wafers. The wafers are composed of a silicon crystal having impurities and, in most situations, dopants. The wafers may also be composed of another semiconductor crystal such as gallium-arsenide. A chemical reaction forms a surface layer that protects the crystal. For example, oxygen may react with the silicon to form a layer of silicon dioxide that covers the surface of the silicon crystal. A radiation-sensitive material, sometimes called photoresist, is coated over the protective layer. The wafer, with its protective layer and photoresist coating, is inserted into the stepper 10.

In the stepper 10, a pattern of radiation can then be projected onto the photoresist. The physical characteristics of the photoresist are affected by exposure to radiation. For one type of photoresist, positive resist, exposure to electromagnetic radiation and then a chemical process results in the removal of the photoresist, leaving in place the photoresist that was not exposed to radiation. For another type of photoresist, negative resist, exposure to electromagnetic radiation enables the photoresist to remain during the subsequent chemical process so that only the unexposed photoresist is removed. In either case, once portions of the photoresist are removed, a chemical reaction can occur to remove the protective layer, for example, silicon dioxide, only where the photoresist has already been removed. Once specific areas of the wafer have been exposed to the semiconductor crystal, the characteristics of those areas can be specifically modified. For example, dopants or electrical contacts can be added. The process can be repeated as many times as necessary to add all of the features desired by the integrated circuit designer. Some integrated circuits require tens of layers.

The scale of the modifications that can be made to the structure of an integrated circuit depends to some extent on the scale of radiation that can be focused on the photoresist in the stepper 10. The photoresist coating of the wafer is not always perfectly flat. For example, previous processing may have developed undulations in the surface. It is important that the focused radiation be extended sufficiently in the vertical dimension to encounter the photoresist regardless of the undulations. The extent to which the radiation extends in the vertical dimension is called depth of field or DOF. The requirements that the radiation be precisely focused in the horizontal dimensions but extend in the vertical dimensions can be difficult to satisfy simultaneously.

The stepper 10 includes a first portion 12 through which wafers are inserted. The stepper 10 positions the wafers to receive electromagnetic radiation. The vertical and horizontal positioning of the wafer is performed to a very small scale. A smaller depth of field requires greater accuracy in the vertical placement of the wafer. Providing such accuracy in a stepper can be very expensive. A second portion 14 of the stepper 10 contains the radiation path and optical components. The optical components are also placed with great precision. The path is not necessarily a straight line because mirrors and other optical components can be used to direct the radiation. In one embodiment, the radiation source projects radiation upward from the bottom of the second portion 14. The radiation encounters several optical components before being redirected downward to a wafer positioned to receive it. The stepper 10 also includes a third portion 16 through which photomasks are inserted into the radiation path. The third portion 16 of the stepper 10 is configured to receive the photomask in a structure having a specific size and shape. A reticle cartridge is a photomask container having the size and shape necessary to be inserted into the stepper 10. As with the wafers, the positioning of the reticle cartridge is performed by the stepper 10 on a small scale.

Figure 2:
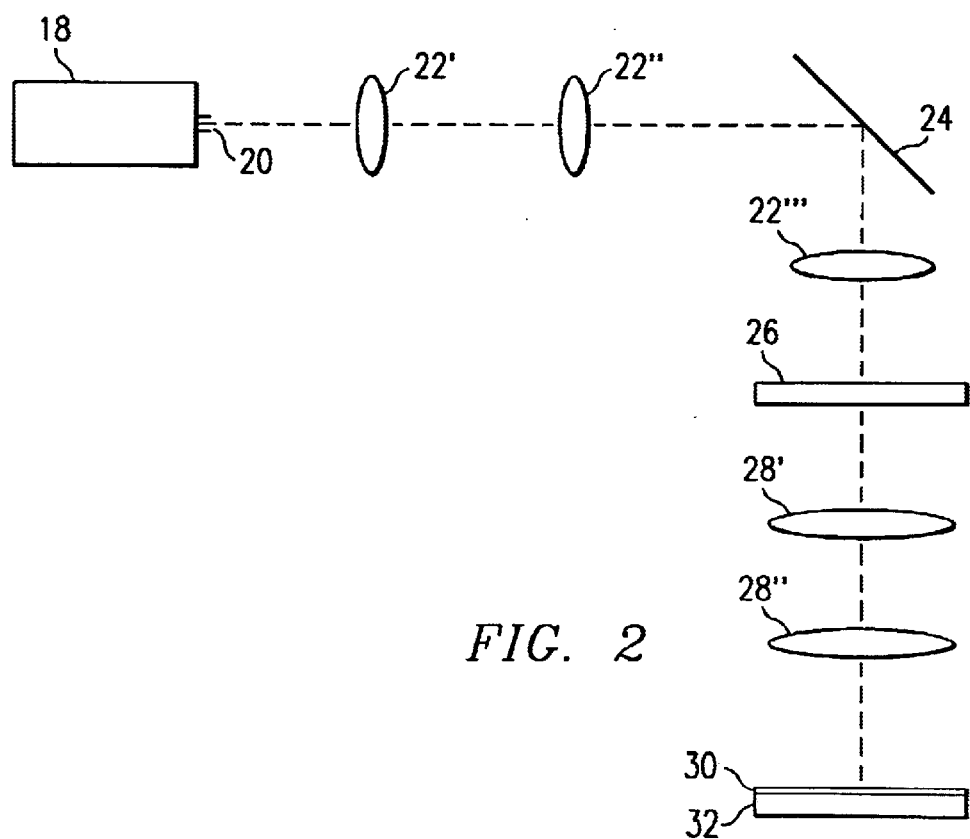
FIG. 2 is a radiation path diagram illustrating one embodiment of the present invention.

FIG. 2 is a radiation path diagram illustrating one embodiment of the present invention. Each of the components shown in FIG. 2 is located in the stepper 10. A radiation source 18 is configured to project electromagnetic radiation through an exit aperture 20. The radiation source can be a laser or some other device capable of providing radiation having a tightly bounded range of frequencies. The radiation then passes through a series of lenses. For example, in FIG. 2, lenses 22',22",22''' are positioned in the path of the projected radiation to modify the optical characteristics of the radiation. For example, the lenses 22',22",22''' are used to collimate the light into a wide parallel beam, for uniform illumination of the mask. A mirror 24 redirects the radiation path. The mirror and lenses 22',22",22''' are mounted in the stepper in precisely determined locations and are generally difficult to modify or remove without damaging the ability of the stepper 10 to precisely focus radiation patterns on radiation-sensitive materials.

The reticle cartridge 26, in contrast, can be removed from the radiation path without damaging the stepper 10. The reticle cartridge 26 contains the photomask which provides the pattern that the radiation reaching the radiation-sensitive material will take. Each layer used in the manufacturing process of an integrated circuit can require a different pattern and, consequently, a different reticle cartridge 26. The lenses 22',22",22''' can be used to direct the radiation to the photomask. The radiation that is able to traverse the reticle cartridge 26 forms a pattern. That patterned radiation is focused by lenses 28',28" making up a projection lens system 28. The pattern can be focused to finer horizontal dimensions at the radiation-sensitive layer 30 than at the reticle cartridge 26. For instance, in many steppers, the projection lens will reduce the image size by a factor of 5. The silicon substrate 32 supports the radiation-sensitive layer 30.

Figure 3:
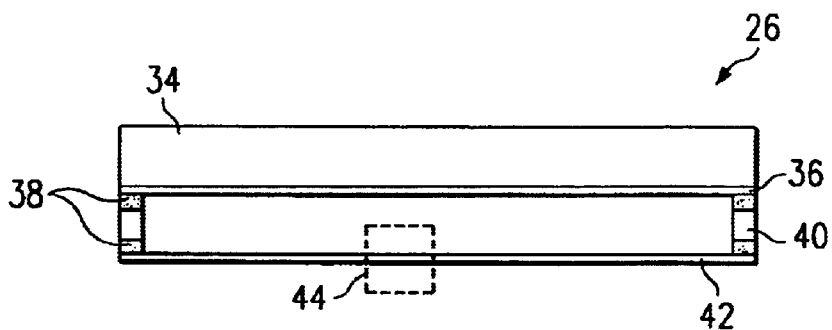
FIG. 3 is a cross-sectional view of a reticle cartridge illustrating one embodiment of the present invention.

FIG. 3 is a cross-sectional view of the reticle cartridge 26 illustrating one embodiment of the present invention. The reticle cartridge 26 includes a transparent plate 34. The transparent plate can be made of many materials including soda lime, borosilicate glass, and fused silica. A thin layer of etched chrome 36 is placed on one surface of the transparent plate 34. The etchings of that layer 36 determine the radiation pattern that will traverse the reticle cartridge 26 to reach the photoresist 30. The etched chrome layer 36 may cover only a portion of the surface of the transparent plate 34. The transparent plate 34 and etched chrome layer 36 together embody a photomask.

The edges of the etched chrome layer 36 are attached to an interferometer frame 40 by adhesive 38. The adhesive 38 can be double back tape, glue or another adhesive. The frame can be coupled to the edges of the layer 36 in a sealed manner. The frame is also attached with adhesive 38 to an interferometer plate 42. That attachment can be sealed so that the chrome layer 36, interferometer frame 40, and interferometer plate 42 define a sealed volume. The sealed volume prevents impurities from reaching the focus plane at the chrome layer 36. The adhesive 38 can be replaced with a mechanical attachment. A portion 44 of the interferometer plate 42 is identified.

While the interferometer plate 42 and photomask are attached to form a reticle cartridge 26 in one embodiment, another embodiment could separate the interferometer plate 42 and the photomask. A stepper 10 could be provided that contained openings into the radiation path for both a reticle cartridge 26 containing the photomask and a separate cartridge containing the interferometer plate 42.

Figure 4:
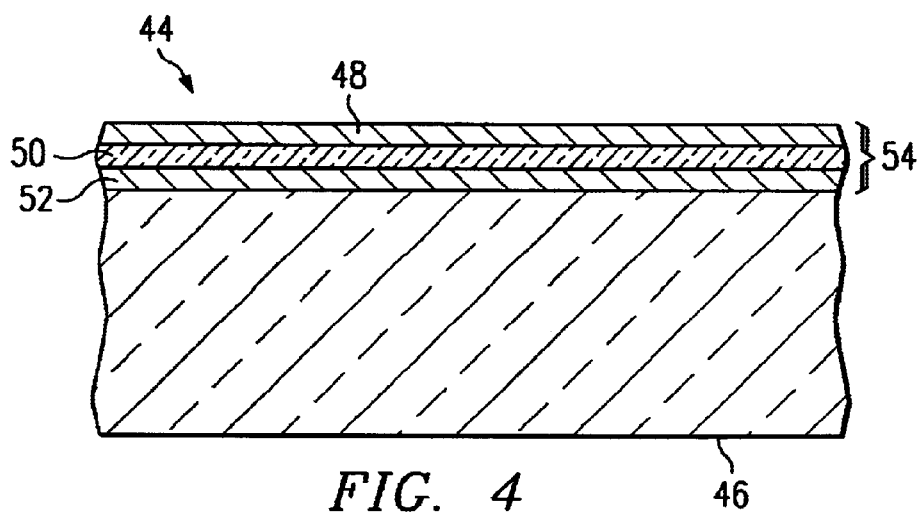
FIG. 4 is an expanded view of a portion of FIG. 3.

FIG. 4 is an expanded view of a portion 44 of the interferometer plate 42. The interferometer plate 42 includes a transparent plate 46, a first partially reflective deposition layer 48, a transmitting deposition layer 50, and a second partially reflective deposition layer 52. The deposition layers together form the Fabry-Perot interferometer 54. The first and second partially reflective deposition layers 48,52 can be reflective dielectric stacks. The transmitting deposition layer 50 can be a layer of silicon dioxide. The reflectivity of the first 48 and second 52 partially reflective layers can be set close to equal. The characteristics of the Fabry-Perot interferometer 54 are then determined by that reflectivity and the distance between the partially reflective layers. Many embodiments of the present invention will employ Fabry-Perot interferometers in which the partially reflecting layers will have reflectivities above twenty-five percent. In one embodiment the reflectivity is ninety-five percent. In another embodiment of the invention, the Fabry-Perot interferometer 54 can be formed by enclosed a radiation transmitting gas between layers of partially reflective material.

Figure 5:
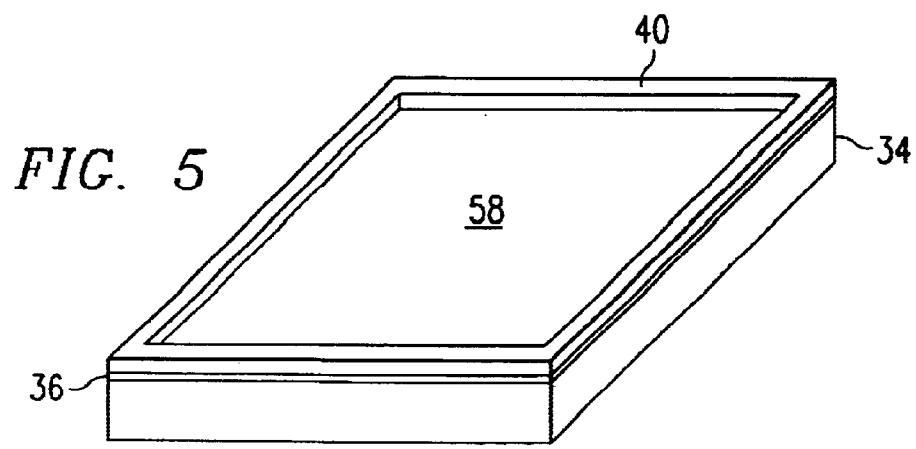
FIG. 5 is a cutaway view of a reticle cartridge illustrating one embodiment of the present invention.

FIG. 5 is a cutaway view of the reticle cartridge 26 illustrating one embodiment of the present invention. The transparent plate 34 and etched chrome layer 36 of the photomask are shown. The interferometer frame 40 is also shown. The orientation is FIG. 5 is vertically opposite the orientation of FIGS. 2, 3, and 4. A region 58 of the chrome layer 36 is surrounded by the interferometer frame 40. The region 58 is in the path of the radiation projected by the radiation source 18.

Figure 6:
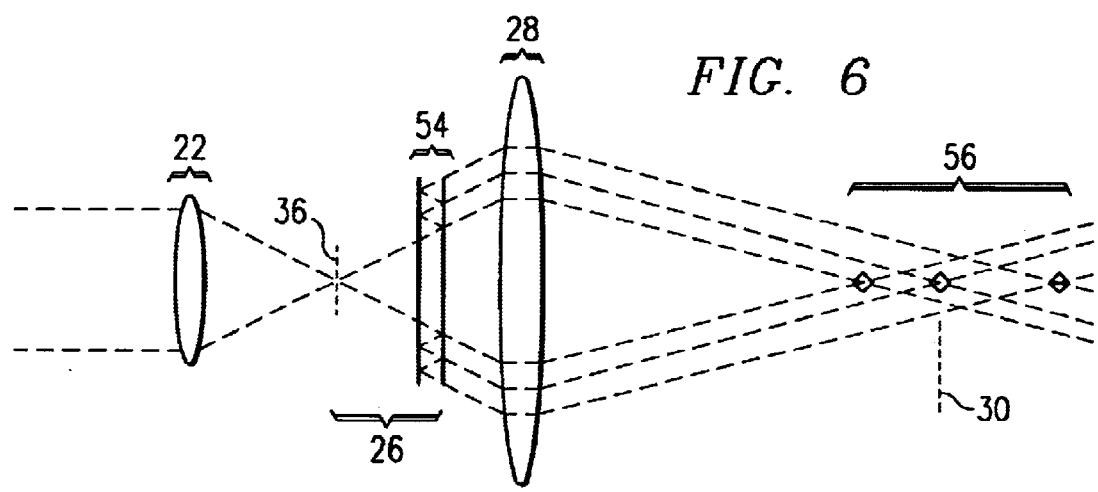
FIG. 6 is a radiation path diagram illustrating multiple images in one embodiment of the present invention.

FIG. 6 is a radiation path diagram illustrating multiple images in one embodiment of the present invention. Radiation received at the pre-mask lenses 22 (including lenses 22',22'',22''') is collimated to illuminate the etched chrome layer 36 that forms a pattern in the radiation. The patterned radiation then reaches the Fabry-Perot interferometer 54. Some of the radiation traverses the interferometer 54 without deviation, while some is reflected within the interferometer 54 and exits at a deviant point. Some radiation intensity is lost in the interferometer 54. The reticle cartridge 26 includes both the etched chrome layer 36 and the interferometer 54. A projection lens system 28 focuses both the deviated and undeviated radiation where the photoresist 30 would receive the radiation. The radiation focuses at multiple points 56 in the radiation path because of the Fabry-Perot interferometer 54 deviations. Each point in the path comprises an image of the pattern from the etched chrome layer 36.

Figure 7A:
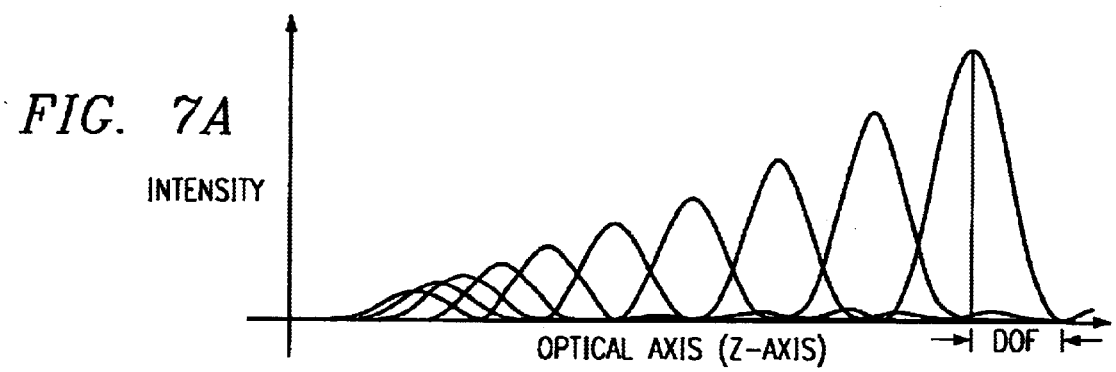
FIG. 7 is a separate and combined view of the intensity of multiple images.
Figure 7B:
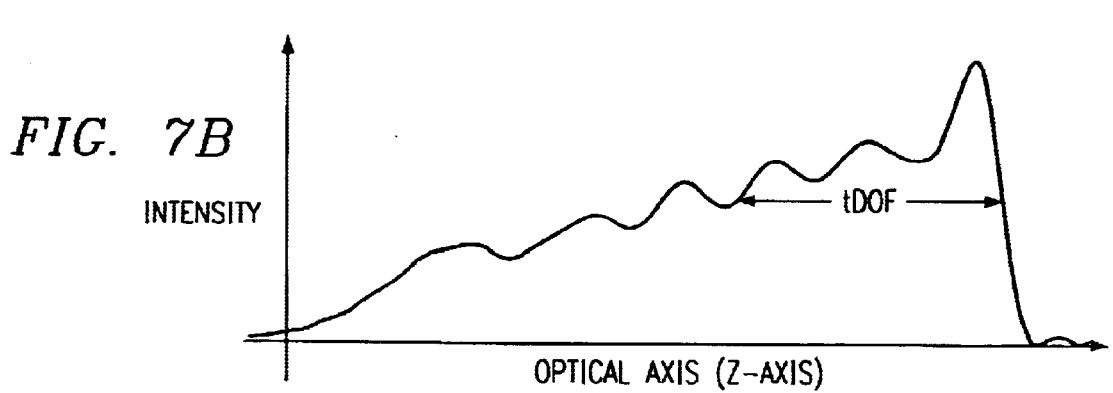

FIG. 7 shows the intensity of the multiple images in both a separate and a combined view. The top chart shows the intensity at points along the vertical axis of each image produced. The largest image, formed by the undeviated radiation, is positioned where the single image would be positioned if the reticle cartridge 26 did not include the Fabry-Perot interferometer 54. The depth of focus (DOF) is shown for that image. The lower chart shows the total intensity at points along the vertical axis resulting from the sum of the images produced by the interferometer 54. The increased DOF is also shown.

In some applications DOF is less important than horizontal resolution. The Fabry-Perot interferometer 54 can improve DOF and horizontal resolution to different degrees depending upon the characteristics of the interferometer 54. For example, the reflectivity of the partially reflective layers 48,52 or the distance between those layers can be modified to change the DOF or horizontal resolution characteristics of the resulting image. One method of calculating the DOF and resolution effects of including an interferometer 54 in the reticle cartridge 26 is discussed in an August 1999 article by Erdelyi et al. in the Journal of the Optical Society of America A. Optics and Image Science entitled "Simulation of coherent multiple imaging by means of pupil-plane filtering in optical microlithography" hereby incorporated by reference in its entirety. Equations can translate the characteristics of the Fabry-Perot interferometer 54 into characteristics of a pupil-plane filter. Software is available, such as Prolith/2 from FINLE Technologies Inc., that will simulate the DOF and horizontal resolution resulting from the pupil-plane filter characteristics.

Although the present invention has been described with several embodiments, various changes and modifications may be suggested to one skilled in the art. It is intended that the present invention encompass such changes and modifications as fall within the scope of the appended claims.

What is claimed is:

1. A reticle cartridge for providing multiple mask images comprising:
    a photomask having first and second sides, the second side partially coated with a radiation blocking material and having coated and uncoated portion; the uncoated portions defining a pattern;
    an interferometer frame attached to the second side of the photomask and defining a first area of the second side, the first area being not in contact with the interferometer frame and within the portions of the second side that are in contact with the interferometer frame; and
    an interferometer plate comprising a Fabry-Perot interferometer, the interferometer plate coupled to the interferometer frame and covering the first area of the second side of the photomask, the combination of photomask, frame and interferometer adapted to be removably inserted into a stepper.

2. The reticle cartridge of claim 1, wherein the Fabry-Perot interferometer comprises three layers, the first and third layers made of partially reflective material having equal reflectivity and the second layer made of transmitting material.

3. The reticle cartridge of claim 1, wherein the radiation blocking material is chrome and the pattern defined by the uncoated portions corresponding to a layer of a circuit design.

4. The reticle cartridge of claim 1, wherein the photomask, the interferometer frame and the interferometer plate define a sealed volume.

* * * * *